United States Patent
Yatsurugi et al.

(10) Patent No.: US 6,503,563 B1
(45) Date of Patent: Jan. 7, 2003

(54) METHOD OF PRODUCING POLYCRYSTALLINE SILICON FOR SEMICONDUCTORS FROM SALINE GAS

(75) Inventors: Yoshifumi Yatsurugi, Fujisawa (JP); Shinichiro Inoue, Hiratsuka (JP)

(73) Assignee: Komatsu Ltd., Tokyo (JP)

( * ) Notice: Subject to any disclaimer, the term of this patent is extended or adjusted under 35 U.S.C. 154(b) by 0 days.

(21) Appl. No.: 09/971,801

(22) Filed: Oct. 9, 2001

(51) Int. Cl.$^7$ .................. C23C 14/16; C23C 16/24; C01B 33/027; C01B 33/029; C01B 33/03
(52) U.S. Cl. .................. 427/255.27; 423/348; 423/349; 427/255.18; 427/255.15; 427/255.17
(58) Field of Search .................. 427/255.23, 255.27, 427/255.28, 255.11, 255.15, 255.17, 255.18; 423/348, 349, 350; 117/88, 89, 101, 105

(56) References Cited

U.S. PATENT DOCUMENTS

| | | | | |
|---|---|---|---|---|
| 3,128,154 A | * | 4/1964 | Bean et al. ............... | 23/223.5 |
| 4,133,000 A | * | 1/1979 | Greenstein ............... | 357/46 |
| 4,147,814 A | * | 4/1979 | Yatsurugi et al. ......... | 472/51 |
| 4,150,168 A | | 4/1979 | Yatsurugi et al. | |
| 4,321,246 A | * | 3/1982 | Sarma et al. ............. | 423/350 |
| 4,656,021 A | * | 4/1987 | Tanabe et al. ............ | 423/350 |
| 4,849,249 A | * | 7/1989 | Ishihara et al. .......... | 427/38 |
| 4,992,846 A | * | 2/1991 | Sakakibara et al. ...... | 357/59 |
| 5,123,975 A | * | 6/1992 | Irinoda et al. ............ | 148/33.2 |
| 5,976,481 A | * | 11/1999 | Kubota et al. ............ | 423/348 |

FOREIGN PATENT DOCUMENTS

| | | |
|---|---|---|
| JP | 45-19562 | 7/1970 |
| JP | 56-45850 | 10/1981 |
| JP | 56-45851 | 10/1981 |
| JP | 56-45852 | 10/1981 |

* cited by examiner

*Primary Examiner*—Timothy Meeks
*Assistant Examiner*—William Phillip Fletcher, III
(74) *Attorney, Agent, or Firm*—Armstrong, Westerman & Hattori, LLP

(57) ABSTRACT

A rod-form high-purity polycrystalline silicon capable of preventing defects from occurring to a newly deposited silicon layer. To this end, a method of producing a rod-form high-purity polycrystalline silicon, depositing silicon on a rod-form silicon core by a thermal decomposition of a silane gas includes the steps of coating the rod-form silicon core to be used with a specific silicon layer by previously depositing any one kind of silicon layer of an amorphous silicon layer and a polycrystalline silicon layer made up of fine particles of silicon with different crystal axes from one another on a surface of the rod-form silicon core to be used by vapor growth, and depositing polycrystalline silicon by using the core coated with the specific silicon layer.

3 Claims, 4 Drawing Sheets

METHOD OF PRODUCING POLYCRYSTALLINE SILICON FOR SEMICONDUCTORS FROM SALINE GAS

TECHNICAL FIELD

The present invention relates to high-purity polycrystalline silicon used in large quantities as substrate materials of semiconductor devices, and particularly to a method of producing a rod-form high-purity polycrystalline silicon using a silane ($SiH_4$) gas as a raw material.

BACKGROUND ART

A half-century has been already passed since high-purity silicon began to be used for semiconductor devices. During this period, the utilization field of high-purity silicon has expanded by being supported by the remarkable progress in semiconductor devices, and the demand thereof has greatly increased. Also, with the improvement in the performance of semiconductor devices, improvement in the quality of a silicon wafer, which is a substrate thereof, has been demanded, and further improvement in the quality of polycrystalline silicon, which is a raw material thereof, has been demanded.

High-purity polycrystalline silicon is melted, and after being remade into a single crystal, it is used for semiconductor devices. As a method for the production of single crystal silicon, there are a floating zone melting method (hereinafter called the FZ method) and a Czochralski method (hereinafter called the CZ method), and forms of polycrystalline silicon used for the methods are different from each other. In the FZ method, polycrystalline silicon produced in a rod form having a diameter of several tens mm or larger and a length of from 1 m to 2 m is used, while in the CZ method, nugget silicon formed by breaking the rod-form polycrystalline silicon is used.

In the FZ method, silicon is not melted in a quartz crucible as in the CZ method, but part of the rod-form silicon is melted in a band from, and the molten silicon is single-crystallized in a state of being supported by the own surface tension. Thus, the quality of the polycrystal that is used largely influences the single crystallization. Conventionally, the FZ method is carried out at least twice to single-crystallize the polycrystal as shown in, for example, Japanese Patent Application Publication No. 45-19562. Specifically, by at least one preliminary FZ method, defects during the growth of polycrystal are vanished, and in at least one subsequent second FZ method using a seed crystal, a single crystal is obtained.

As disclosed, for example, in Japanese Patent Application Publication No. 56-45852, at the beginning of the growth of polycrystal, that is, during the period of time in which the entire surface of the silicon core is covered with newly deposited silicon, the temperature of the silicon core is maintained to be lower by several tens°C. than the temperature at an ordinary thermal decomposition. According to this, a method of reducing defects near the interface between the silicon core surface and newly grown polycrystal has been tried.

However, the above prior art has the following disadvantages. In the production method disclosed in the aforementioned Japanese Patent Application Publication 45-19562, the FZ method is carried out at least twice. Thus, there arises the disadvantage of the production cost becomes very high because of the FZ apparatus cost, the FZ operation cost (expenses and labor), and the material loss for the polycrystal regulation occurring each time at carrying out the FZ method. Further, the rod-form polycrystalline silicon obtained by the production method disclosed in the aforementioned Japanese Patent Application Publication No. 56-45852 cannot achieve a satisfactory single crystal by carrying out the FZ method one time. As a result, it also has the disadvantage that the production cost becomes very high.

From the above, recently, a method of producing a polycrystalline rod capable of achieving single crystallization by carrying out the FZ method only one time has been strongly demanded.

SUMMARY OF THE INVENTION

In order to meet the above demand, the inventors have investigated in detail the various correlations between the defects of the polycrystalline silicon, and the single crystallization rate, the silicon compound to be used, the growth conditions of the silicon suitable for the compound, various kinds of cores and the like. As a result, the inventors have obtained the investigation results that the defects such as a defect in a whisker form occurring near the interface between a silicon core and newly grown polycrystalline silicon, the porosity and the like reduce the single crystallization rate, that the favorable cleanness of the core surface reduces the occurring ratio of the defects, that the occurrence of the defects differs greatly according to the kinds of substrates, and the like. Also, the inventors have reached the conclusion that it is impossible to reduce the aforementioned defects to almost zero level, which we demand, with the present technique of cleaning the silicon core surface and maintaining it in the industrial thermal decomposition reactor.

As explained thus far, the present invention is a production method achieved through the above process. Its object is to provide a method of producing a rod-form high-purity polycrystalline silicon capable of preventing defects occurring to a newly deposited silicon layer by using a silicon core having a specific silicon surface at the occasion of producing the polycrystalline silicon.

In order to attain the above object, a method of producing a rod-form high-purity silicon according to the present invention is a method of producing rod-form high-purity polycrystalline silicon depositing silicon on a rod-form silicon core by a thermal decomposition of a silane gas, comprising the steps of:

coating the rod-form silicon core to be used with a specific silicon layer by previously depositing any one kind of silicon layer o f an amorphous silicon layer and a polycrystalline silicon layer made up of fine particles of silicon with different crystal axes from one another on a surface of the rod-form silicon core to be used by vapor growth; and depositing polycrystalline silicon by using the core coated with the specific silicon layer.

The above invention method (hereinafter called "the present invention method") is the method obtained as a result of the microscopic analysis of the beginning of the thermal decomposition of a silane gas with use of the substrate having various different surfaces. Specifically, the method utilizes the property of the silicon layer newly deposited on the silicon core that the structure similar to the surface structure of the substrate used is first deposited during the initial deposition of several tens $\mu$m, and thereafter a dendrite being the original polycrystalline structure is gradually deposited. When the surface of the substrate is coated with a specific silicon layer such as amorphous silicon, or polycrystalline silicon layer made up of fine particles of silicon with different crystal axes from one another, the occurrence of the defects due to abnormal growth was hardly observed. The aforementioned specific silicon layer with a thickness of several μm or more provides the effect. Further, the result that the substrate coated with the specific silicon layer has fewer occurrences of defects, as the storage until the time just before its use becomes better.was obtained. The present invention is the method made by industrially developing the above results.

By carrying out the aforementioned present invention method, it becomes unnecessary to adopt special reaction conditions capable of causing a trouble in order to restrain the occurrence of the defects at the beginning of the polycrystalline silicon production by the thermal decomposition of silane gas. Consequently, extremely favorable rod-form high-purity silicon without a defect which is suitable for the FZ method under the best deposition conditions for polycrystalline silicon, can be obtained.

Further, the method of producing the rod-form high-purity polycrystalline silicon, the vapor growth, may be chemical vapor deposition (hereinafter called the CVD method) with use of any one kind of gas of gaseous silicon hydrides ($Si_nH_{2n+2}$.n=1 ,2, . . . ) and a mixture of the same hydrides.

Regarding the implementation of the above CVD method, the high-frequency plasma CVD method is suitable as the met hod for industrially depositing amorphous silicon layer on a silicon core, and the thermal decomposition method is suitable as t he industrial deposition method of the polycrystalline silicon film made up of fine particles of silicon with different crystal axes from one another.

As a raw material for the CVD method, the gaseous silicon hydrides, the mixture of the same hydrides, or the gas prepared by diluting the hydrides with an inert gas or a hydrogen gas, is used for both the above methods. Of the gaseous silicon hydrides, the industrially available gases are silane gas and a disilane ($Si_2H_6$) gas. Accordingly, the experiment on an industrial scale was made with use of these gases. By carrying out this method explained above, the same effects as the above present invention method can be obtained.

Furthermore, in the method of producing the rod-form high-purity polycrystalline silicon, the vapor growth for depositing the specific silicon layer may be physical vapor deposition (hereinafter called the PVD method).

In the above method, the vacuum evaporation method, sputtering method, and the sublimation method are cited as the PVD method, and the vacuum evaporation method is an industrially suitable method. For the evaporation source in this case, the high-frequency (HF) heating method of rod-form silicon the high purity of which is insured with ease is suitable. By carrying out this method, the same effects as the aforementioned present invention method can be obtained.

BEST MODE FOR CARRYING OUT THE INVENTION

Apparatuses used for the Examples will be explained below with reference to the explanatory drawings.

Figure 2:
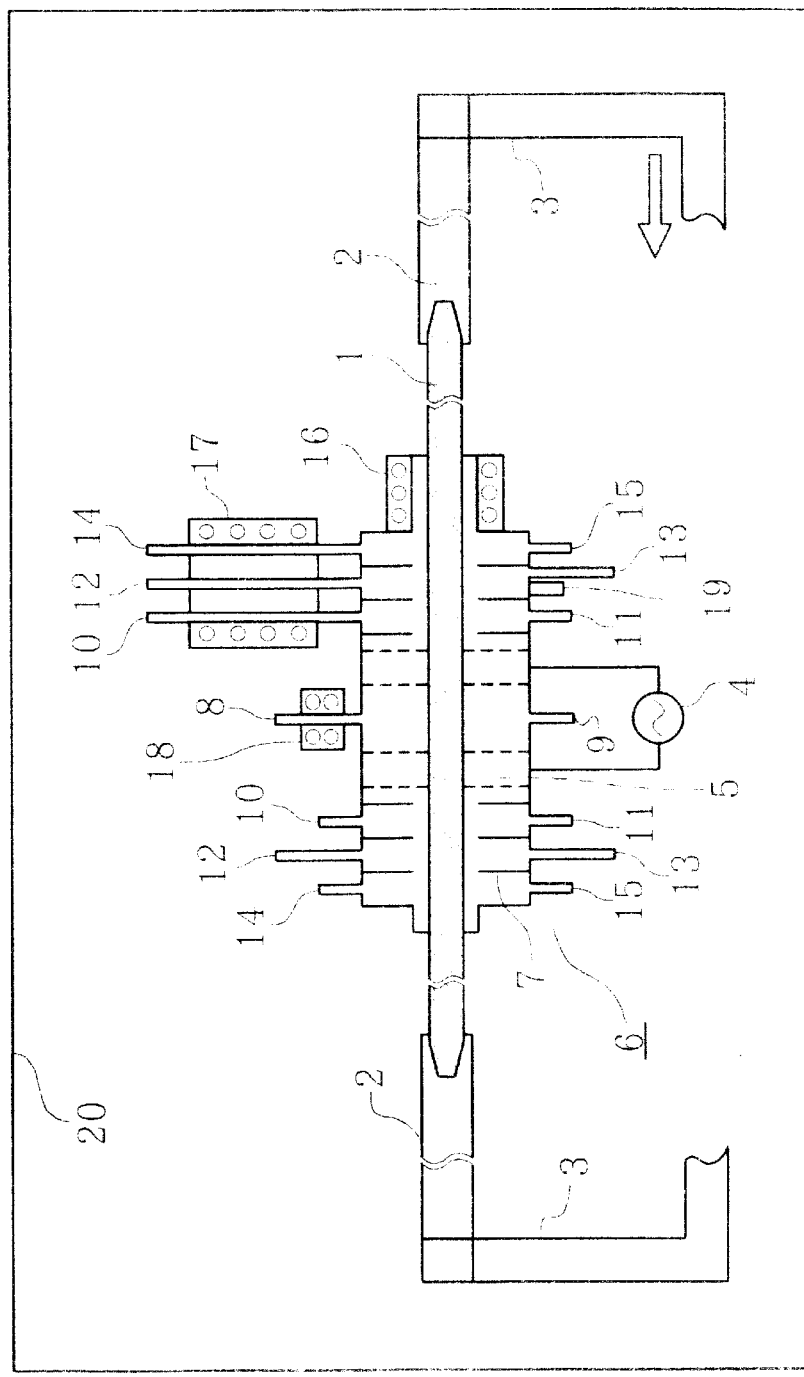
FIG. 2 is an explanatory view of an apparatus for depositing an amorphous silicon layer by a plasma CVD method of the present invention.

FIG. 2 is an explanatory view of an apparatus for depositing a specific silicon layer on a rod-form silicon core surface by a plasma CVD method. In FIG. 2, 1 denotes a rod-form silicon core, 2 denotes a supporter made of silica glass, and the core 1 is supported only at both ends thereof by the supporter 2. The supporter 2 is fixed to a drive device 3. The drive device 3 is structured to move the core 1 into a plasma CVD unit from one end and to the other end thereof to allow the specified silicon layer to uniformly deposit on its surface. HF electrodes 5 for plasma generation are placed in a center portion of a CVD reaction tube 6, and connected to an HF generator 4. A pair of HF electrodes 5 and 5 are structured so that a space between them is adjustable. 16 denotes a heater for heating the silicon core 1, and 17 denotes a heater for heating the same gas (base gas) as a gas with which a raw gas is diluted and an inert gas for safety. 18 denotes a heater for heating a raw gas for depositing the specified silicon layer. 8 and 9 denote an inlet and an outlet for the raw gas. 10 and 11 denote an inlet and an outlet for the same gas as the gas ($H_2$, Ar or He) with which the raw gas is diluted. 12 and 14 denote inlets for an inert gas for safety (He or Ar), and 13 and 15 denote outlets therefor. The CVD reaction tube 6 having the CVD unit, the gas inlets (supply ports), the outlets (discharge ports) and the like is made of silica glass and an inside thereof is divided by a partition 7 for limiting a flow path of each gas. The temperature of the silicon core 1 is measured by a pyrometer (not shown) from an observation window 19. The apparatus thus explained is housed in a vacuum cell 20 that can be evacuated for safety, and the total operation related to the CVD such as the attachment, detachment, and temporary storage of the core 1, and the like is automated.

Figure 3:
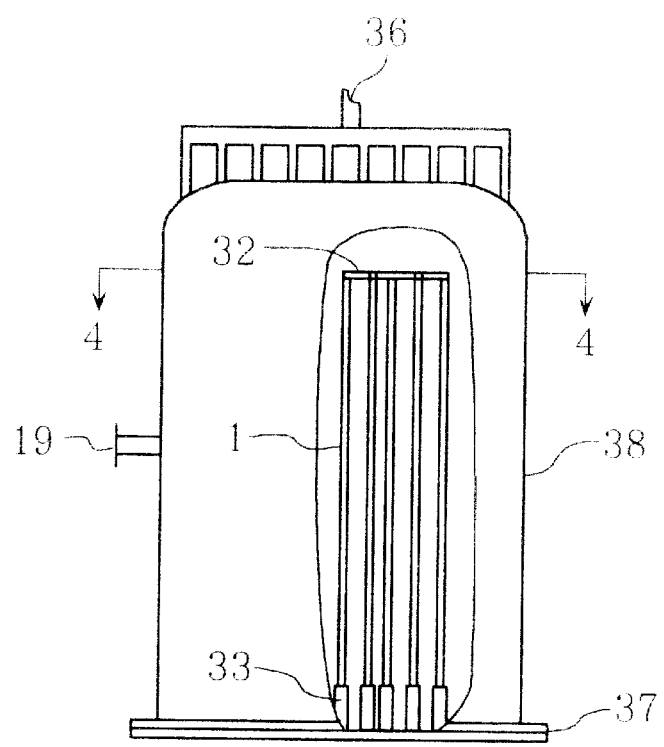
FIG. 3 is a fragmentary sectional front view explaining deposition of polycrystalline silicon layer made up of fine particles of silicon with different crystal axes from each other by gaseous silicon hydrides of the present invention.
Figure 4:
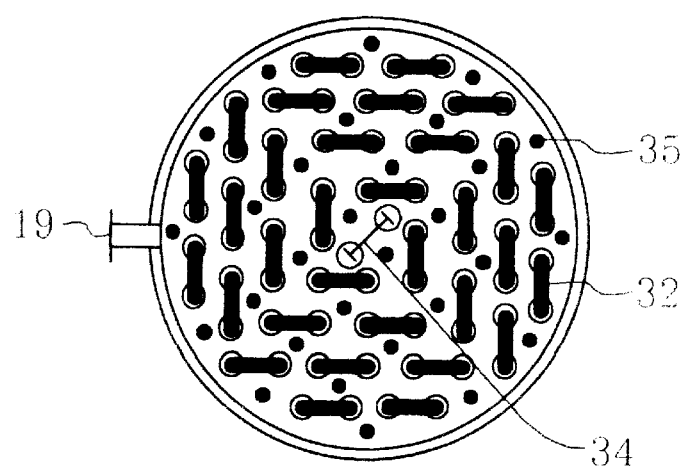
FIG. 4 is a sectional view taken along the 4—4 line in FIG. 3.

FIG. 3 and FIG. 4 are explanatory views of a thermal decomposition reactor for depositing a polycrystalline silicon layer made up of fine particles of silicon with different axes from one another on a rod-form silicon core by the thermal decomposition of gaseous silicon hydrides. FIG. 3 is a fragmentary sectional front view of the thermal decomposition reactor, and FIG. 4 shows a sectional view taken along the 4—4 line in FIG. 3. This thermal decomposition reactor does not include a water-cooling thermal shield plate for thermally shielding silicon cores between them peculiar to the reactors for producing polycrystalline silicon by the thermal decomposition of a silane gas disclosed in Japanese Patent Application Publication No. 56-45850 (U.S. Pat. No. 4,150,168) and Japanese Patent Application Publication No. 56-45851 (U.S. Pat. No 4,147,814). 1 denotes a rod-form silicon core a number of which are attached, and 32 denotes a silicon bridge for connecting to the two cores 1 at its upper end portion. 33 denotes a water-cooling electrode connected to the core 1. The silicon core 1 is heated by electric power supplied from the water-cooling electrode 33, and the temperature thereof is measured by a pyrometer (not shown) placed outside an observation window 19. A number of water-cooling electrodes 33 are attached at a water-cooling base flange 37. After the silicon core 1 is attached, a water-cooling bell jar 38 is closed, and the inside of the reactor is evacuated, and after the inert gas replacement and the hydrogen gas replacement are carried out, the silicon core 1 is heated. As for the flow of the gas into the reactor, it is uniformly flown into the entire reactor from a number of gas inlets 35 provided in the water-cooling base flange 37. The gas is gathered through a number of discharge portions provided at an upper portion of the bell jar 38, and is discharged outside from an outlet 36. Heating the silicon core 1 for the CVD method is started by increasing the temperature of a graphite heater 34 placed in a center portion of the reactor at first to heat the nearby silicon core 1 by radiation. Subsequently, an electric current is fed through the core 1 to increase the temperature thereof. In this step, heating of the graphite heater 34 is finished. Next, the silicon core 1 with the increased temperature heats the silicon core 1 around its periphery by radiation, and subsequently, electric current is fed through the silicon core 1 to increase its temperature. Thereafter, the same operation is repeated to increase the temperature of all the silicon cores 1. The reason of the complicated operations being repeated as described above is that it is difficult to heat the core 1 from the room temperature by directly feeding an electric current through the core 1, for the silicon core 1 is a semiconductor. In order to increase the temperature directly from the room temperature, it is necessary to provide an expensive special high-voltage power unit and an apparatus with high electrical insulation measures being applied thereto. After all the silicon cores 1 are increased in temperature, the silicon cores 1 are maintained at a fixed temperature, and the CVD method is carried out.

Figure 5:
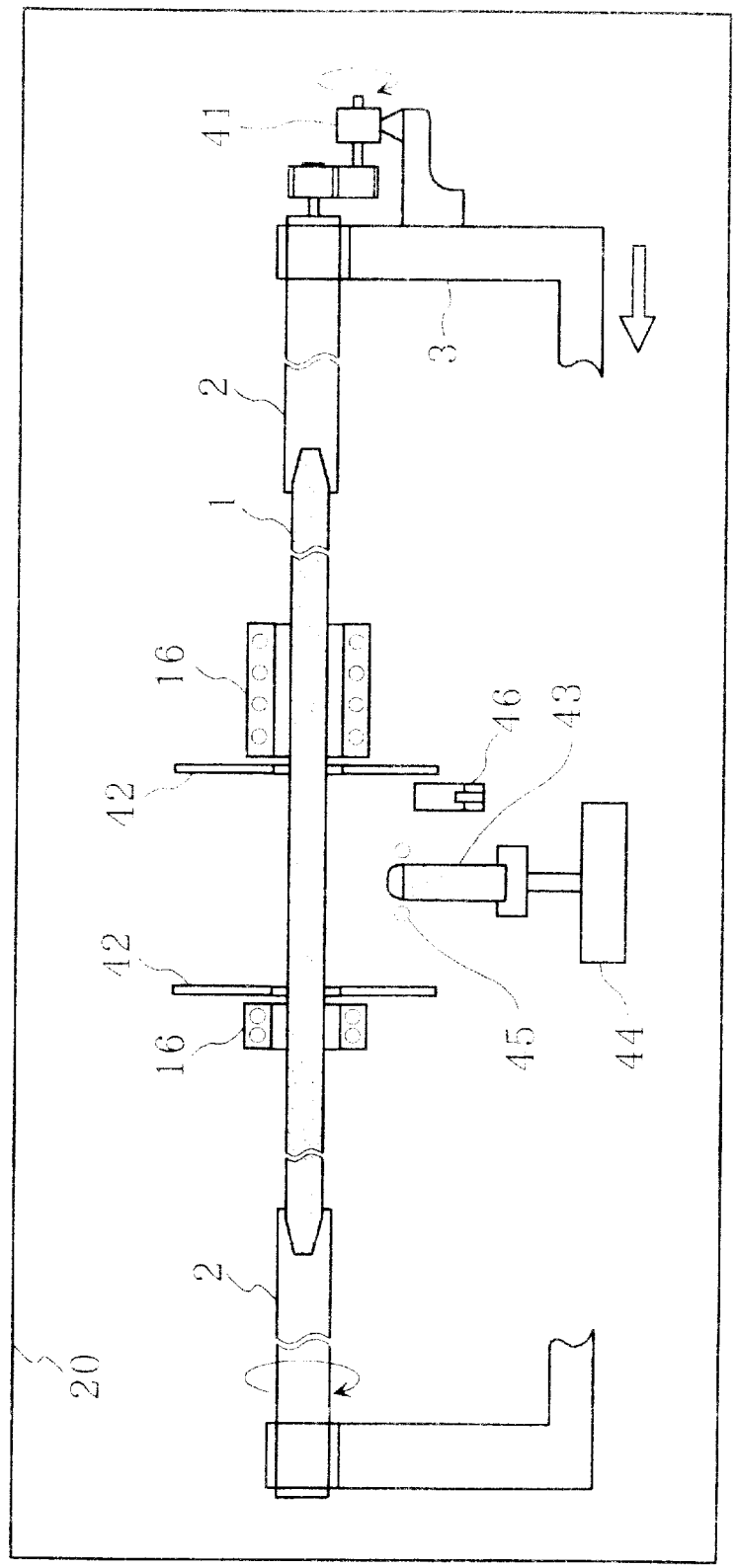
FIG. 5 is an explanatory view of an apparatus for depositing an amorphous silicon layer by a vacuum evaporation method of the present invention.

FIG. 5 shows an explanatory view of an apparatus for depositing a specific silicon layer on a rod-form silicon core surface by a vacuum evaporation method. In FIG. 5, 1 denotes a rod-form silicon core, 2 denotes a supporter made of silica glass for supporting the rod-form silicon core 1 while rotating it, 3 denotes a drive device for supporting and driving the supporter 2, and 41 denotes a rotary mechanism for rotating the supporter 2. 16 denotes a heater for heating the rod-form silicon core 1, 46 a pyrometer for measuring the temperature of the silicon core 1, 43 a silicon rod being an evaporation source of silicon, and 45 an HF heating coil for melting an upper tip end of the silicon rod 43. 42 denotes a silica glass shield plate for preventing vaporized silicon from scattering, and 44 denotes a support base including a mechanism for moving the silicon rod 43 up and down while supporting it. The entire apparatus explained above is housed in a vacuum cell 20, and each operation is designed to be automatically performed from the outside of the vacuum cell 20.

The method of producing rod-form high-purity polycrystalline silicon according to this invention will be explained with reference to the following Examples.

EXAMPLE 1

Figure 1:
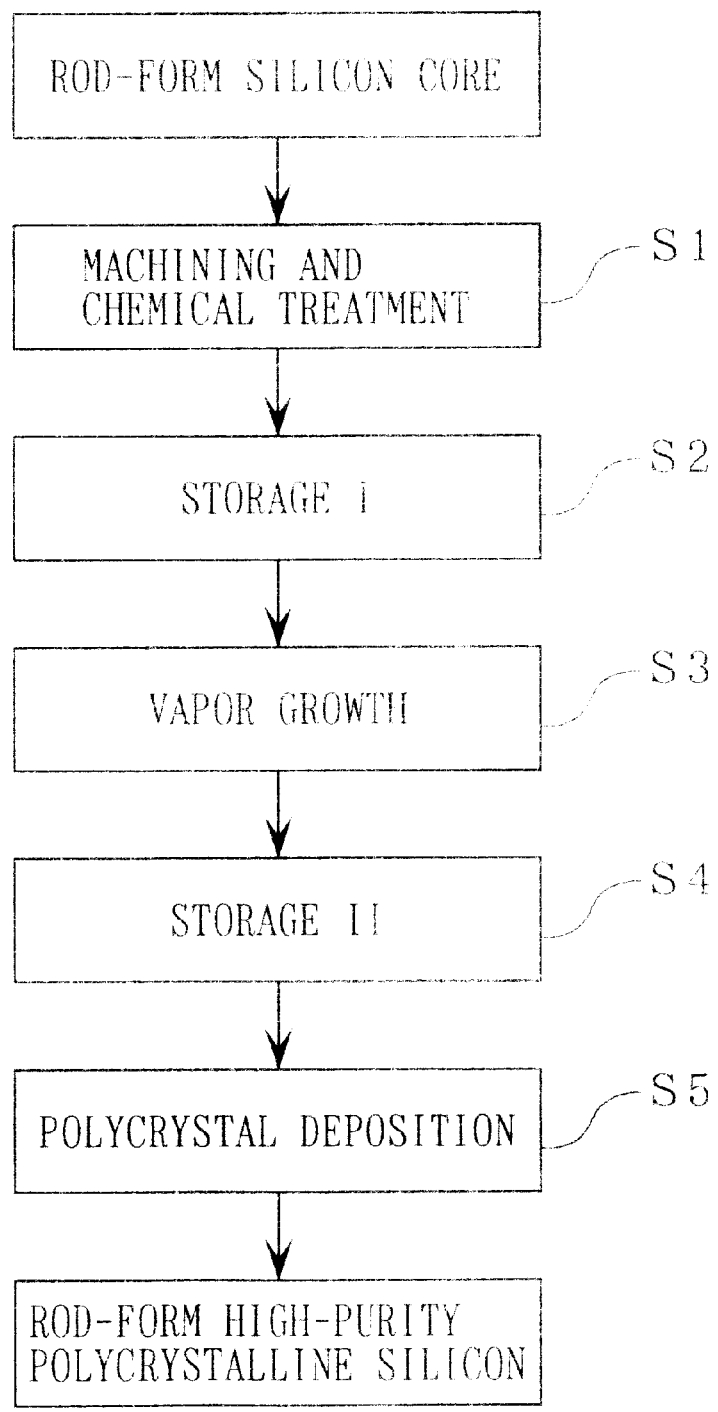
FIG. 1 is a flowchart showing a sequence of steps of an embodiment of the present invention.

FIG. 1 is a flowchart showing the sequence of the steps of the example of the present invention. In FIG. 1, S1, S2, . . . , S5 represent the steps of the present invention, and the step of depositing a specific silicon layer on the rod-form silicon core 1, which is a characteristic of the present invention, is step S3. The example will be explained below in order.

In step S1, the rod-form silicon core 1 with a diameter of 7 mm and a length of 2 m, made by the special FZ method (slim rod method), is subjected to the machining at its both ends, etching with a mixed solution of hydrofluoric acid and nitric acid for cleaning, washing with pure water, and drying. In step S2 (specifically, storage I), the clean rod-form silicon core 1 is temporarily stored in a closed vessel with a jig capable of supporting it only at the both ends. The inside of the closed vessel is replaced with a high-purity nitrogen gas to keep the quality of the rod-form silicon core 1, and it is maintained at a positive pressure. Instead of the nitrogen gas, a helium gas or an argon gas may be used. Step S3 is a vapor growth step for depositing a specific silicon layer on the rod-form silicon core 1. In this example, by using the apparatus shown in FIG. 2, amorphous silicon with a thickness of from 2.5 $\mu$m to 3.5 $\mu$m was deposited on the core 1 by the plasma CVD method. The details of the conditions of the CVD method are as follows: the diameter of the reaction tube 6 is 50 mm, the output power of the HF generator 4 is 8 MHz·1 kW, the space between the electrodes 5 is 30 mm, the pressure of the vacuum cell 20 is 500 Pa, the diluent gas is a hydrogen gas, the concentration of a silane gas is 20%, the inert gas is argon, the temperature of the core 1 is from 330° C. to 350° C., and the like. The flow of each gas was controlled so that a small amount of silane gas is included in the outlet 11 for the hydrogen gas and almost no leakage of the hydrogen gas exists in the outlets 13 and 15 for the argon gas. The core 1 with the specific silicon layer being deposited thereon, which was taken out of the CVD apparatus in FIG. 2, was stored under a clean condition in step S4 (specifically, storage II) that is under the same conditions as storage I of step S2. Step S5 is the step of producing the rod-form polycrystalline silicon by a silane gas, and in this example, the silicon was grown until the diameter became 100 mm by the thermal decomposition of a silane gas.

No defect was observed outwardly in the rod-form polycrystalline silicon product grown on the specific silicon layer. In order to observe the inner part of the product in detail, the specimens of a length of 10 cm were taken from the both ends of the obtained rod-form polycrystalline silicon, and the specimens were axially cut into two. After the cut surfaces were lapped, etching was performed, and the portion near the silicon core 1 was inspected for defects. The defects by abnormal growth and porosity were not observed from the both specimens. The single crystal was produced from the residual rod-form polycrystalline silicon by the FZ method, and the result of 100% yield was obtained. The result of the rodform polycrystalline silicon produced by the conventional method used at the same time was the value in the range of from 92% to 94%, and the noticeable difference was recognized.

EXAMPLE 2

A disilane gas in concentration of 10% was used instead of the silane gas in Example 1. The other conditions were the same as those in Example 1. As a result of analyzing the remaining amount of the silane gas and the disilane gas in the gases discharged from the raw gas outlets in Example 1 and Example 2, it was found that the disilane gas is easier to be decomposed than the silane gas. By using the rod-form silicon core 1 on which the obtained amorphous silicon was deposited, the rod-form polycrystalline silicon was produced under the same conditions as in Example 1. The same inspection as in Example 1 was carried out, and the inspection result in agreement with Example 1 was obtained.

EXAMPLE 3

The mixture gas of disilane in a concentration of 5% and the silane gas in concentration of 10% was used instead of the silane gas in Example 1. With the other conditions being the same, amorphous silicon was deposited on the silicon core 1, and polycrystalline silicon was produced with use of the core 1, and polycrystalline silicon was produced with use of the core 1 with the deposition. The same inspection as in Example 1 was carried out, and the satisfactory result in agreement with Example 1 was obtained.

EXAMPLE 4

As the vapor growth in step S3 in Example 1, the CVD method by the thermal decomposition of a silane gas is carried out with use of the apparatus shown in FIG. 3 and FIG. 4.

The rod-form silicon core 1 was taken out from the container of storage I in FIG. 1, and was loaded in the thermal decomposition reactor for depositing a specific silicon layer. The bell jar 38 was closed, the inside of the reactor was evacuated, and an argon gas was filled in the reactor. Further, after the inside of the reactor was sufficiently replaced with a hydrogen gas by the pressure-swing method with use of the raw gas inlet 35 and the raw gas outlet 36, the inside of the reactor was maintained at 500 Pa while flowing the hydrogen gas. After it was confirmed that the silicon core 1 and the graphite heater 34 were ohmically connected and that each part of the thermal decomposition reactor was sufficiently water-cooled, all the cores 1 were increased in temperature according to the operation procedure already explained and the CVD was carried out at 700° C. The silane gas being a raw gas was diluted with a hydrogen gas to 20% and was uniformly fed from a number of gas inlets 35. The polycrystalline silicon layer made up of fine particles of silicon with different axes from one another with a thickness of from 2.5 $\mu$m to 3.5 $\mu$m was deposited. After the silane gas was not detected in the exhausted hydrogen gas after the feeding of the silane gas was stopped, the silicon core 1 was cooled.

After storage II of the silicon core 1 taken out of the thermal decomposition reactor, the polycrystalline deposition was carried out under the same conditions as in Example 1. The obtained product was subjected to the same inspection as in Example 1 in the polycrystalline state, and the single crystallization by the FZ method was also carried out. The obtained results were favorable in Example 1.

EXAMPLE 5

The experiment was made by exchanging the silane gas in concentration of 20% in Example 4 to the disilane gas in concentration of 8% with the other conditions being the same as in Example 4. Both the inspection result of the obtained product in the polycrystalline state and the result of the single crystallization by the FZ method were favorable as in Example 1.

EXAMPLE 6

The experiment was made by exchanging the silane gas in concentration of 20% in Example 4 to the mixture gas of the silane gas in concentration of 10% and the disilane gas in concentration of 5% with the other conditions being the same as in Example 4. Both the inspection result of the obtained product in the polycrystalline state and the result of the single crystallization by the FZ method were favorable as in Example 1.

EXAMPLE 7

The vapor growth step S3 in Example 1 was carried out by the vacuum evaporation method with use of the apparatus in FIG. 5. The rod-form silicon core 1 in step S1 was attached to the supporter 2 in the vacuum cell 20, and the silicon rod 43 melted by the FZ method is attached at the support base 44, respectively. After the inside of the vacuum cell 20 was evacuated, the core 1 was heated to 300° C. to 330° C. by the heater 16, and the temperature was measured with the pyrometer 46. During the evaporation of the silicon, the core 1 was rotated at 3 rpm. As for the heating of the silicon rod 43, a carbonized silicon piece (not shown) placed near the silicon rod 43 was heated by the HF heating coil 45 at first, then the silicon rod 43 was preliminarily heated by the radiation heat and heated by the coil 45. The depositing speed of the amorphous silicon layer was controlled according to the diameter of the silicon rod 43 and the distance between the silicon rod 43 and the silicon core 1. The amorphous silicon layer of from 2.5 $\mu$m to 3.5 $\mu$m was deposited as in Example 1, and the production of the rod-form high-purity polycrystalline silicon was carried out under the same conditions as in Example 1.

The inspection result of the obtained product in the polycrystalline state and the result of the single crystallization by the FZ method were favorable as in Example 1.

By carrying out the present invention explained above, i) the introduction of the special thermal decomposition conditions for reducing defects at the beginning of the thermal decomposition becomes unnecessary, and the trouble accompanying the special conditions is eliminated; ii) the defects generated near the silicon core is reduced; and a rod-form high-purity polycrystalline silicon iii) with the oxygen content being reduced; and iv) with satisfactory single crystallization by the FZ method, can be obtained.

What is claimed is:

1. A method of producing rod-form polycrystalline silicon for semiconductors, depositing silicon on a rod-form silicon core by a thermal decomposition of a silane gas, comprising the steps of:

coating a rod-form silicon core with a specific silicon layer comprising any one kind of silicon layer of an amorphous silicon layer and a polycrystalline silicon layer on a surface of the rod-form silicon core, said specific silicon layer deposited by vapor growth and said polycrystalline layer made up of fine particles of silicon with different crystal axes from one another; and then depositing polycrystalline silicon on the core coated with the specific silicon layer.

2. The method of producing the rod-form polycrystalline silicon for semiconductors in accordance with claim 1, wherein the vapor growth is chemical vapor deposition with use of any one kind of gas of gaseous silicon hydrides and a mixture of the hydrides.

3. The method of producing the rod-form polycrystalline silicon for semiconductors in accordance with claim 1, wherein the vapor growth is physical vapor deposition.

* * * * *

UNITED STATES PATENT AND TRADEMARK OFFICE
CERTIFICATE OF CORRECTION

PATENT NO. : 6,503,563 B1
DATED : January 7, 2003
INVENTOR(S) : Yatsurugi, Yoshifumi et al.

It is certified that error appears in the above-identified patent and that said Letters Patent is hereby corrected as shown below:

<u>Title page, Item [54], and Column 1, lines 1, 2 and 3,</u>
Change "METHOD OF PRODUCING POLYCRYSTALLINE SILICON FOR SEMICONDUCTORS FROM SALINE GAS" to be -- METHOD OF PRODUCING POLYCRYSTALLINE SILICON FOR SEMICONDUCTORS FROM SILANE GAS --

Signed and Sealed this

Twenty-third Day of September, 2003

JAMES E. ROGAN
*Director of the United States Patent and Trademark Office*